(12) United States Patent
Raman et al.

(10) Patent No.: US 10,554,219 B2
(45) Date of Patent: Feb. 4, 2020

(54) ANALOG-TO-DIGITAL CONVERTER

(71) Applicant: MELEXIS TECHNOLOGIES SA, Bevaix (CH)

(72) Inventors: Johan Raman, Knesselare (BE); Pieter Rombouts, Mariakerke (BE)

(73) Assignee: MELEXIS TECHNOLOGIES SA, Bevaix (CH)

( * ) Notice: Subject to any disclaimer, the term of this patent is extended or adjusted under 35 U.S.C. 154(b) by 0 days.

(21) Appl. No.: 16/378,794

(22) Filed: Apr. 9, 2019

(65) Prior Publication Data
US 2019/0312584 A1 Oct. 10, 2019

(30) Foreign Application Priority Data

Apr. 10, 2018 (EP) .................................. 18166658

(51) Int. Cl.
*H03M 3/00* (2006.01)

(52) U.S. Cl.
CPC ........... *H03M 3/414* (2013.01); *H03M 3/368* (2013.01); *H03M 3/412* (2013.01); *H03M 3/438* (2013.01); *H03M 3/458* (2013.01)

(58) Field of Classification Search
CPC ....... H03M 3/414; H03M 3/458; H03M 3/382
USPC .................... 341/143, 155, 120, 118, 144
See application file for complete search history.

(56) References Cited

U.S. PATENT DOCUMENTS

| | | | |
|---|---|---|---|
| 4,112,871 A * | 9/1978 | Newman | A01K 31/06 119/464 |
| 6,313,774 B1 | 11/2001 | Zarubinsky et al. | |
| 6,404,368 B1 | 6/2002 | Yamaguchi | |
| 9,397,692 B1 * | 7/2016 | Zanbaghi | H03M 3/438 |
| 2002/0121994 A1 * | 9/2002 | Bolton, Jr. | H03L 7/1976 341/143 |
| 2011/0050475 A1 | 3/2011 | Straeussnigg et al. | |
| 2016/0006452 A1 * | 1/2016 | Saito | H03M 3/418 348/302 |
| 2018/0302102 A1 * | 10/2018 | Oshima | H03M 3/388 |

OTHER PUBLICATIONS

Extended European Search Report from EP Application No. 18166658.7, dated Oct. 4, 2018.

* cited by examiner

*Primary Examiner* — Peguy Jean Pierre
(74) *Attorney, Agent, or Firm* — Workman Nydegger

(57) ABSTRACT

An analog-to-digital converter comprises a first quantizer arranged for yielding a first digital signal; an error signal generation block arranged for generating an error signal representative of a difference between an analog input signal and the first digital signal; an analog loop filter arranged for receiving the error signal; a second quantizer arranged for receiving an output signal of the analog loop filter and for outputting a second digital signal; a digital loop filter arranged for receiving the second digital signal and for providing an input signal to the first quantizer; and a recombiner block comprising a first recombination and a second recombination filter, and an adder circuit for adding outputs of the first and second recombination filters. The first and second recombination filters are selected to obtain an analog-to-digital converted output signal being less dependent on quantization noise caused by the first quantizer than a first digital signal.

15 Claims, 5 Drawing Sheets

ANALOG-TO-DIGITAL CONVERTER

FIELD OF THE INVENTION

The present invention is generally related to the field of converter circuits for converting an analog signal into a corresponding digital signal.

BACKGROUND OF THE INVENTION

This invention is concerned with analog-to-digital conversion, i.e. with converting an analog input signal into a corresponding digital output signal having only discrete output values that change at discrete instants in time (the sampling instants). The analog input signal may correspond to an electrical quantity, such as a voltage, a current, a charge, . . . , but also to other types of physical quantities that have an analog nature, such as a position, an angle, a phase, etc.

Analog-to-digital converters are considered which contain a feedback loop. A/D converters with such a scheme are encountered for example in Sigma-Delta modulators (SDM). FIG. 1 provides an illustration. The feedback loop (1) comprises means (11) for evaluating an error between an analog input $V_i$ and the digital output $D_{out}$, a loop filter (12) which operates on the error signal (14) and selectively amplifies frequencies in the signal band of interest, and a quantizer (13) which maps the filter output signal to a discrete digital value (at the sample instants).

In the particular case of an SDM, error evaluation involves a digital-to-analog converter (DAC) for translating the digital output signal to an analog signal that is subtracted from the analog input signal. The complexity of this so called feedback DAC strongly depends on the number of bits. Also, an important problem in SDMs relates to imperfections of this feedback DAC, e.g. its non-linearity. Techniques to deal with this problem exist, e.g. dynamic elements matching or calibration approaches, but these become quite involved (e.g. in terms of required on-chip area) when the feedback DAC has many bits. In general, it is easier to deal with non-linearity problems when the number of levels of the feedback DAC limited (hence, with fewer bits). The DAC resolution is also directly linked to the resolution of the quantizer (13). Also here, circuit-level implementations of the quantizer (13) become easier as the number of bits drops.

The loop filter (12) in FIG. 1 usually comprises an analog filter. In some prior art schemes the loop filter also comprises an ADC (i.e. another quantizer) for conversion to the digital domain and also a digital filter. The scheme therefore has two quantizers in the loop. An important motivation for using such a dual quantization architecture is to limit the number of feedback bits. It requires less complex feedback circuits and gives rise to easier to solve non-linearity problems (e.g. easier implementation of dynamic element matching, a digital correction table, etc.).

Many prior art dual-quantization schemes exist wherein the second quantizer is outside the loop. The second quantizer may then process the analog quantization error of the first quantizer, as is for instance the case in multi-stage noise shaping (MASH) ADCs. Alternatively, the second quantizer may process the same analog input signal as the first quantizer, but again operating outside the loop.

In US2011/050475 an analog-to-digital converter is disclosed comprising an analog component that receives an analog input signal and provides a digital signal, a digital filter component to filter the digital signal and provide a filtered digital signal, a quantizer to quantize the filtered digital signal and provide a quantized digital signal. This prior art loop has two quantizers in the loop, the first being explicitly mentioned above and the second associated with the analog component implicitly performing a quantization by providing a digital signal. The approach aims at cancelling the quantization noise of the explicit quantizer (having a digital input). For this, the filtered digital signal and the quantized digital signal are combined and next applied to a reconstruction component that yields a reconstructed signal. This reconstructed signal is then combined with the quantized signal to provide the A/D converted signal as output. A characteristic feature of this approach for cancelling quantization noise is that the signal transfer function, i.e. the transfer of the input signal to the digital output, remains fixed. The solution proposed in US2011/050475 is, however, only one possible way to compensate for quantization noise caused by the quantizer (13) positioned after the loop filter in FIG. 1.

For some applications wherein an A/D converter as in FIG. 1 is employed, it is advantageous to make the signal transfer function equal to one (at all frequencies). This, for instance, provides a large bandwidth, which on its turn is favourable for obtaining a fast response to sudden changes of the input. In prior art structures with dual in-loop quantization, a known technique for making the signal transfer function unity cannot be easily applied. A known approach is to provide an extra feed-in path for directly coupling the input signal to the input of the quantizer that provides the loop output.

In an A/D converter with dual in-loop quantization (i.e. comprising an ADC in the loop filter) the input of the quantizer that provides the tracking loop output is in the digital domain. Therefore, a direct path from the input of the A/D converter to the quantizer input would require another ADC to be added to the system, for conversion of the analog input signal to a digital signal that may then be added to the quantizer input. So, the signal transfer function of the loop cannot be easily manipulated by structural changes of the feedback loop itself, such as adding extra feed-in paths using the input signal.

Hence, there is room for alternatives and improvements with respect to quantization noise compensation in an A/D converter and the filters used thereto.

SUMMARY OF THE INVENTION

It is an object of embodiments of the present invention to provide for an A/D converter structure having a feedback loop and being arranged to reduce or even eliminate the quantization noise introduced by a quantizer in the structure operable in the digital domain. It is also an object to provide for an A/D converter structure having a feedback loop and having an improved signal transfer function.

The above objective is accomplished by the solution according to the present invention.

In a first aspect the invention relates to an analog-to-digital converter comprising a first quantizer arranged for yielding a first digital signal,
an error signal generation block arranged for generating an error signal representative of a difference between an analog input signal and the first digital signal,
an analog loop filter arranged for receiving the error signal
a second quantizer arranged for receiving an output signal of the analog loop filter and for outputting a second digital signal, a digital loop filter arranged for receiving the second digital signal and for providing an input signal to the first quantizer, a recombiner block comprising a first recombination filter arranged to receive the first digital signal, a second recombination filter arranged to receive the second digital signal and an adder circuit for adding outputs of the first and the second recombination filter, said recombination filters being selected to obtain an analog-to-digital converted output signal being less dependent on quantization noise caused by the first quantizer than the first digital signal.

The proposed solution indeed allows for reducing the quantization noise introduced by the first quantizer that outputs said first digital signal. The proposed solution also allows changing the signal transfer function, e.g. for the purpose of obtaining faster response times. Because the second digital signal is more upstream (i.e. closer to the input), usage of this signal allows obtaining an analog-to-digital converted output signal which is more responsive to changes in the input signal.

In a preferred embodiment the analog loop filter has a transfer function substantially equal to the ratio of the first recombination filter's transfer function and the second recombination filter's transfer function. In case the analog loop filter transfer function exactly equals said ratio, the contribution of the quantization noise is completely eliminated. However, it is an important advantage of the present invention that even if there is a relative deviation A between the analog loop filter transfer function and the ratio, there is still an important reduction of the quantization noise caused by the first quantizer, provided the relative deviation A remains moderate, e.g $|\Delta|<10\%$.

In an advantageous embodiment the first recombination filter and/or the second recombination filter are adaptive. Preferably the first recombination filter and/or second recombination filter are adapted to remove a dependency of the analog-to-digital converted output signal ($D_{out}$) from the quantization noise of said first quantizer determined in the digital domain. In a specific embodiment said quantization noise is determined by digitally subtracting the input of the first quantizer from its output.

In preferred embodiments the first recombination filter and/or second recombination filter has a programmable gain. The analog-to-digital converter advantageously comprises a gain controller unit to determine that programmable gain.

Preferably the first quantizer has a lower resolution than the second quantizer. This is particularly advantageous for reducing the complexity associated with the evaluation of the error in the error signal generation block.

In embodiments of the invention the analog-to-digital converter comprises a compensation filter to compensate for a delay introduced by the first recombination filter.

In other embodiments the digital loop filter comprises an accumulator/integrator. In an advantageous embodiment the digital loop filter comprises a feedforward path for improving the dynamic response of the feedback loop.

In embodiments of the invention the second quantizer is embedded in an internal feedback loop comprising a further analog loop filter and a feedback digital-to-analog converter.

In certain embodiments of the invention the error signal generation block comprises a digital-to-analog conversion circuit.

In embodiments the analog input signal is derived from a set of sensor elements. In a specific embodiment the sensors are Hall elements. Advantageously, the analog-to-digital converter comprises a combiner circuit for combining signals from the set of sensor elements and generating the error signal.

Advantageously, the first recombination filter and/or second recombination filter are Finite Impulse Response filters. In a specific embodiment the first recombination filter is a FIR filter proportional to the numerator polynomial in $z^{-1}$ of $H_a(z)$, and/or B(z) is a FIR filter proportional to the denominator polynomial in $z^{-1}$ of $H_a(z)$.

For purposes of summarizing the invention and the advantages achieved over the prior art, certain objects and advantages of the invention have been described herein above. Of course, it is to be understood that not necessarily all such objects or advantages may be achieved in accordance with any particular embodiment of the invention. Thus, for example, those skilled in the art will recognize that the invention may be embodied or carried out in a manner that achieves or optimizes one advantage or group of advantages as taught herein without necessarily achieving other objects or advantages as may be taught or suggested herein.

The above and other aspects of the invention will be apparent from and elucidated with reference to the embodiment(s) described hereinafter.

BRIEF DESCRIPTION OF THE DRAWINGS

The invention will now be described further, by way of example, with reference to the accompanying drawings, wherein like reference numerals refer to like elements in the various figures.

DETAILED DESCRIPTION OF ILLUSTRATIVE EMBODIMENTS

Figure 1:
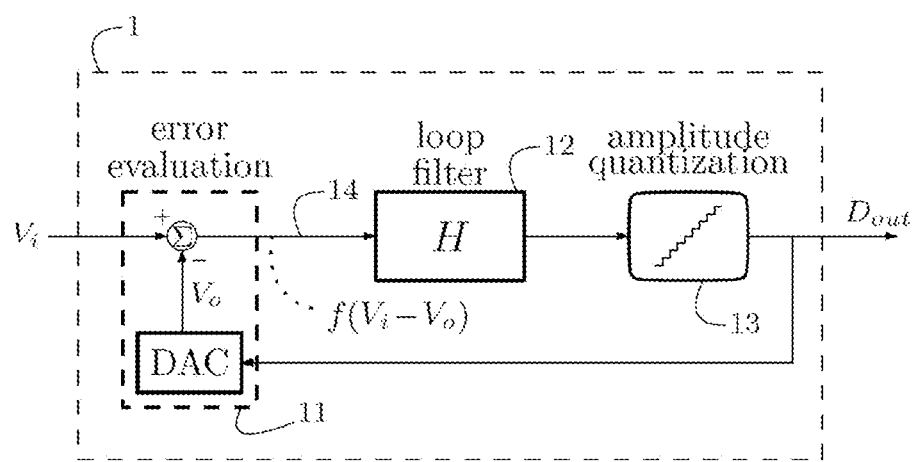
FIG. 1 illustrates a block scheme of a Sigma-Delta modulator as known in the art.

The present invention will be described with respect to particular embodiments and with reference to certain drawings but the invention is not limited thereto but only by the claims.

Furthermore, the terms first, second and the like in the description and in the claims, are used for distinguishing between similar elements and not necessarily for describing a sequence, either temporally, spatially, in ranking or in any other manner. It is to be understood that the terms so used are interchangeable under appropriate circumstances and that the embodiments of the invention described herein are capable of operation in other sequences than described or illustrated herein.

It is to be noticed that the term "comprising", used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B. It means that with respect to the present invention, the only relevant components of the device are A and B.

Reference throughout this specification to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment, but may. Furthermore, the particular features, structures or characteristics may be combined in any suitable manner, as would be apparent to one of ordinary skill in the art from this disclosure, in one or more embodiments.

Similarly it should be appreciated that in the description of exemplary embodiments of the invention, various features of the invention are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this invention.

Furthermore, while some embodiments described herein include some but not other features included in other embodiments, combinations of features of different embodiments are meant to be within the scope of the invention, and form different embodiments, as would be understood by those in the art. For example, in the following claims, any of the claimed embodiments can be used in any combination.

It should be noted that the use of particular terminology when describing certain features or aspects of the invention should not be taken to imply that the terminology is being re-defined herein to be restricted to include any specific characteristics of the features or aspects of the invention with which that terminology is associated.

In the description provided herein, numerous specific details are set forth. However, it is understood that embodiments of the invention may be practiced without these specific details. In other instances, well-known methods, structures and techniques have not been shown in detail in order not to obscure an understanding of this description.

The present invention aims to propose an analog-to-digital converter (also referred to as A/D converter or ADC) comprising a feedback loop with so called dual in-loop quantization, i.e. having a structure wherein two quantizers are applied in the feedback loop.

The A/D converter according to the invention is advantageously a tracking loop. A tracking loop keeps track of an external phase, angle or position in an incremental way, based on comparing a "predicted" output to the actual phase/angle/position. Such tracking loops can cope better with non-stationary situations, e.g. in which the phase/angle/position changes continuously with time. This occurs for instance in motor applications, where the rotation angle of the rotor typically changes with a relatively constant but possibly high speed, and thus the actual angle increases linearly with time. In such applications, tracking loops may, for instance, be beneficially used for providing a near-zero latency output. This means that an accurate output phase/position/angle is provided even when the input phase/position/angle changes with constant but possibly very high (angular) speed. The tracking loop may also be optimized for good dynamic responses, e.g. a fast response to steps or sudden speed changes.

The tracking loop according to the present invention may relate to a position sensor. Position may refer to a linear displacement, a rotation angle, etc. With the position to be measured, an input phase $\theta_i$ is associated. The position sensor may be an angular sensor, in which case the input phase $\theta_i$ may be the same as the mechanical rotation angle $\theta_{mech}$, i.e. $\theta_i = \theta_{mech}$ a (linear) function of the mechanical rotation angle, e.g. $\theta_i = k \cdot \theta_{mech} + \phi_0$ with k some proportionality factor, and $\phi_0$ the phase at a zero position. The position sensor may be a linear displacement sensors, in which case the input phase $\theta_i$ may be a linear function of the mechanical displacement $x_{mech}$, e.g. $\theta_i = k \cdot x_{mech} + \phi_0$ with k some proportionality factor, and $\phi_0$ the phase at a zero position.

The position sensor may be a magnetic position sensor which, for instance, measures the displacement of a magnetic field with respect to the position sensor, or which measures the angle of a magnetic field relative to the sensor orientation. In these magnetic position sensors the magnetic field may be generated by a magnet or it may be generated by an excitation coil. In magnetic position sensors, the sensing elements may be based on horizontal or vertical Hall elements, GMR or TMR sensing elements, etc. This may be in combination with a magnetic layer (e.g. an integrated layer or IMC) that locally alters the magnetic field, e.g. change its direction, e.g. from an in-plane magnetic field to a vertical magnetic field. Magnetic position sensor may also rely on an angle-dependent mutual inductance between a driving coil and one or more sense coils, for instance an electrical resolver.

Figure 2:
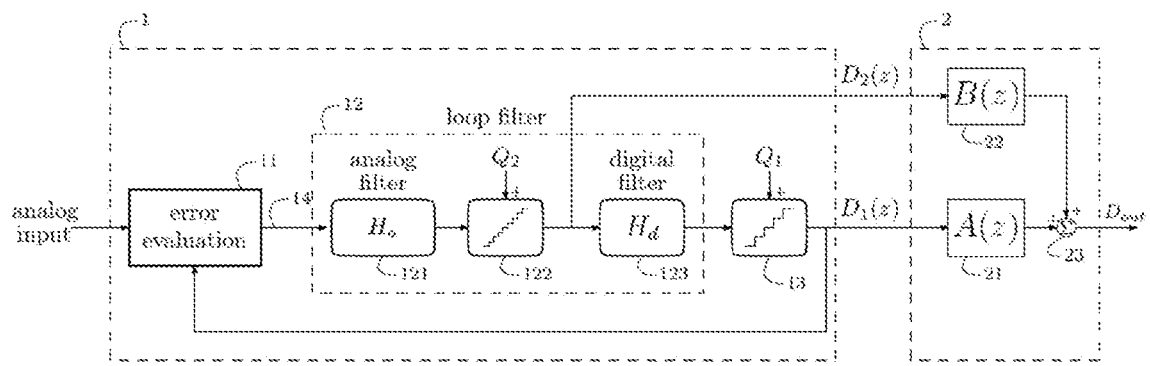
FIG. 2 illustrates a block scheme of an A/D converter according to the invention.

A scheme of an analog-to-digital converter with dual in-loop quantization according to the present invention is shown in FIG. 2. A first quantizer (13) provides a digital output value ($D_1$) of the loop (hence appearing at the end of the forward path). This first quantizer may typically have a limited number of bits, e.g. for reducing the complexity associated with error evaluation. Contrary to many prior art systems, this first quantizer is in the digital domain and its input is provided by a digital loop filter having a transfer function $H_d$. The loop further comprises an analog loop filter having a transfer function $H_a$ followed by a second quantizer. The second quantizer provides the input of the digital loop filter $H_d$. The operation of the quantizers can be modelled as adding a quantization error to the respective quantizer input signal, the quantization error being defined as the difference between the output and the input of the quantizer. Therefore two extra "sources" can be identified in the system, being $Q_1$ and $Q_2$ representing the quantization error of the first and second quantizer, respectively. Note that $Q_1$ may be considered a knowable quantity in present system, since both the input and the output of the first quantizer are in the digital domain, and hence these signals can be digitally subtracted to obtain $Q_1$. In contrast, $Q_2$ cannot be determined (without extra measurements) because the input of the second quantizer is an unknown analog signal. A classical approach is therefore to consider $Q_2$ as a source of random noise. With respect to $Q_1$, the situation may be different. Since perfect knowledge of $Q_1$ can be obtained, it may be possible to compensate the effects caused by it. A key question is of course how to do this and to what extent this is possible when there are uncertainties in the system, such as when one has only imprecise knowledge of the analog filter transfer function $H_a$. If no such compensation is implemented, $Q_1$ again needs to be treated as a source of random noise that has an impact on the resolution of the overall system. The purpose of the A/D converter circuit of the present invention is to largely eliminate the effects of $Q_1$. Some disclosed embodiments are capable of coping with imprecise knowledge of the analog filter transfer function $H_a$, and even allow adapting to time-varying changes in this filter.

Using linear system analysis, the two digital outputs $D_1$ and $D_2$ in the above system can be determined as a function of the input signal $V_i$ and the two quantization error sources $Q_1$ and $Q_2$:

$$\begin{cases} D_1 = STF \cdot V_i + NTF \cdot Q_1 + H_d \cdot NTF \cdot Q_2 \\ D_2 = \dfrac{STF}{H_d} \cdot V_i - H_a \cdot NTF \cdot Q_1 + NTF \cdot Q_2 \end{cases} \quad (1)$$

In this expression the following transfer functions appear:

$$\begin{cases} STF = \dfrac{H_a H_d}{1 + H_a H_d} \\ NTF = \dfrac{1}{1 + H_a H_d} \end{cases} \quad (2)$$

These transfer functions are known in the context of Sigma-Delta modulators as the signal transfer function (STF) and the noise transfer function (NTF).

In accordance with the present invention, the two digital quantizer outputs $D_1$ and $D_2$ are filtered by digital filters $A(z)$ and $B(z)$, respectively, and then added. The thus obtained recombined output $D_{out}$ can be expressed as:

$$D_{out}(z) \triangleq A(z)D_1(z) + B(z)D_2(z) \quad (3)$$

Substituting expression (1) in (3) it can be easily shown that if $$\dfrac{A(z)}{B(z)} = H_a \quad (4)$$

then $$D_{out}(z) = A(z)\left(V_i + \dfrac{1}{H_a(z)} Q_2\right) \quad (5)$$

Since $Q_1$ does not appear in the compensated output $D_{out}(z)$, the proposed recombination has completely eliminated the contribution of $Q_1$. It is, however, shown later in this description that it is not strictly needed that the ratio of the transfer functions of the digital filters $A(z)$ and $B(z)$ exactly equals $H_a$.

The advantage of the dual-quantization scheme is that the first quantizer may have a low resolution (i.e. a low number of bits), because the corresponding quantization error $Q_1$ can be eliminated in the above explained manner. This way, the number of feedback levels may be restricted, which can significantly simplify the design of the error evaluation block. For instance, for the case of an SDM, a feedback DAC with at most a few bits makes it easier to optimize the system for good linearity. In an extreme embodiment a one-bit quantizer can be used. The corresponding one-bit feedback DAC is considered inherently linear, because it only has two input-output pairs, which necessarily lie on a straight line.

Another advantage offered by the invention can be understood by observing the transfer of the input signal $V_i$ to the digital output. In the compensated output (5) of the A/D converter according to the present invention, this transfer is $A(z)$. In case of the prior art method US2011/050475 and also when using $D_1$ as (uncompensated) output, the signal transfer function is $STF(z)$ as defined in (2). This $STF(z)$ is fixed by the choices for the analog and digital loop filters $H_a$ and $H_d$, respectively. In contrast, it can be seen that (4) allows much freedom in selecting the recombination filters $A(z)$ and $B(z)$. It is therefore possible to exploit this freedom to arrive at a more beneficial signal transfer function $A(z)$.

Figure 3:
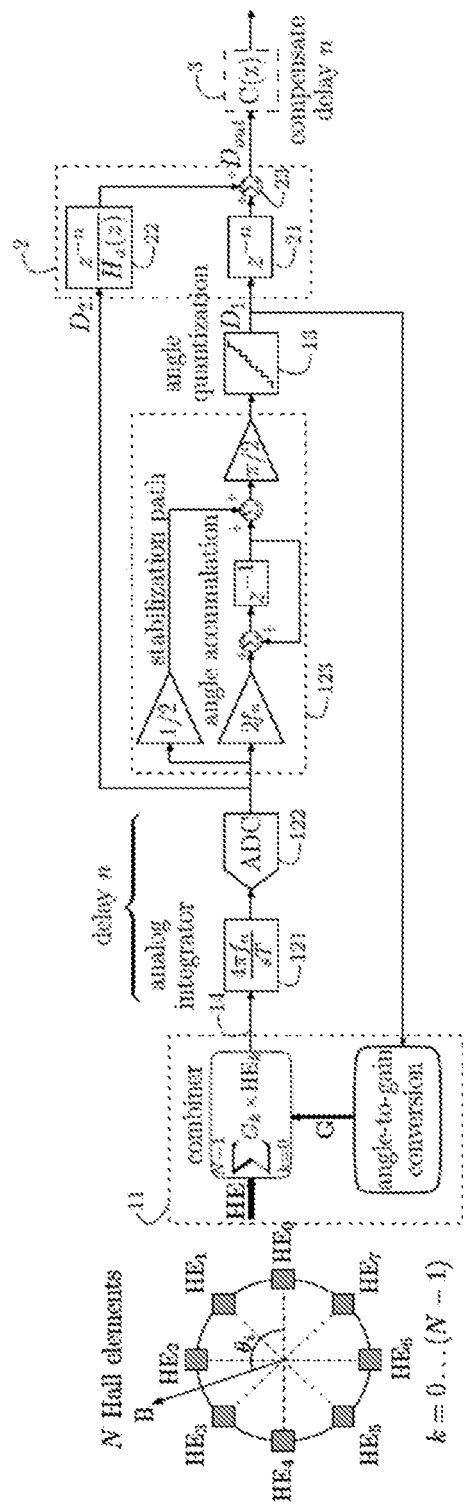
FIG. 3 illustrates an angular sensor operated as a tracking loop, providing an A/D conversion of the input angle according to the invention.

As an example an angular sensor is considered which is operated as a tracking loop. FIG. 3 illustrates such a system. The tracking loop in this example contains:

N Hall plates arranged to receive different projections of a magnetic field having an angle $\theta_i$ relative to the angle sensor a combiner circuit which simultaneously combines all Hall element signals with an array of weights that depends on a quantized feedback angle ($D_1$) and outputs an error signal representative of the difference between the input angle $\theta_i$ and the feedback angle, an analog integrator that integrates the error signal an ADC that quantizes the integrator output and produces samples thereof at a rate 1/T a digital filter comprising an accumulator/integrator of the ADC output and a feedforward path to improve the feedback loop dynamic response an angle quantization unit that maps the digital filter output to a limited number (e.g. 16) of allowed feedback angles Further there is a recombiner block. As detailed below, a delay compensation filter can optionally be provided as well. In FIG. 3 a possible sizing of the loop filter is detailed, wherein $f_n$ represents a normalized frequency that controls the bandwidth of the loop (relative to the sample frequency 1/T).

In general, the interconnection complexity of the combiner circuit reduces when the number of bits of the angle quantizer is lowered. A small number of bits implies a larger angle quantization error, and the strategy to deal with angle quantization error as disclosed in present invention is therefore highly relevant.

An important quantity is the delay n—expressed as a number of sample intervals (T)—between the digital feedback signal ($D_1$) and the digital output of the ADC ($D_2$). Contributions to this delay may come from a delay in the feedback path, a delay associated with the integrator circuit, the conversion time of the ADC, etc.

Figure 4:
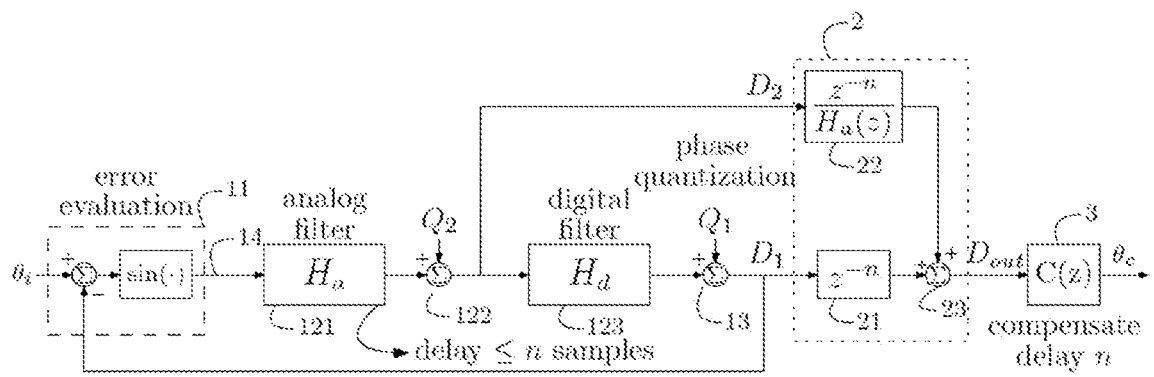
FIG. 4 illustrates an embodiment of the A/D converter of the invention comprising a filter to compensate delay.

The more compact system-level diagram of FIG. 4 can then be derived for the system as described. In the present example, the error evaluation block produces an output signal proportional to the sine of the difference between input angle and the feedback angle corresponding with $D_1$. Because $\sin x \approx x$ for x sufficiently small, the non-linear characteristic can often be neglected when in tracking mode. In the system level diagram the (total) delay n has been included in the analog filter transfer function $H_a$, while the feedback path and the first quantizer are idealized as having no delay. In the considered exemplary case, the analog filter has a transfer function given by $$H_a = K \frac{z^{-n}}{1-z^{-1}},$$

with K a proportionality factor accounting for a multitude of scale factors (such as the magnetic field strength, the Hall element sensitivity, the time constant of the integrator, etc.).

In this exemplary embodiment the recombiner block uses the following recombination filters:

$$\begin{cases} A(z) = z^{-n} \\ B(z) = \dfrac{z^{-n}}{H_a(z)} \end{cases} \quad (6)$$

For this choice the condition (4) is obviously met. The reason why the extra delay $z^{-n}$ is introduced, is to make the filter B(z) physically realizable. For this example one obtains $$B(z) = \frac{1-z^{-1}}{K},$$

which represents a realizable FIR filter.

The choice $A(z)=z^{-n}$ implies that the input signal is also delayed by n samples, which can be seen from (5). In case of angular sensors operating at high rotation speeds, this extra delay may cause noticeable angle errors, especially if n>1. In such cases, an optional delay compensation filter may be added to the system whose purpose is to compensate the delay n of the filter A(z). One example of a compensation filter for compensating a delay n is:

$$C(z) = 1 + \frac{a(1-z^{-1})}{1-\left(1-\dfrac{a}{n}\right)z^{-1}} \quad (7)$$

Figure 5:
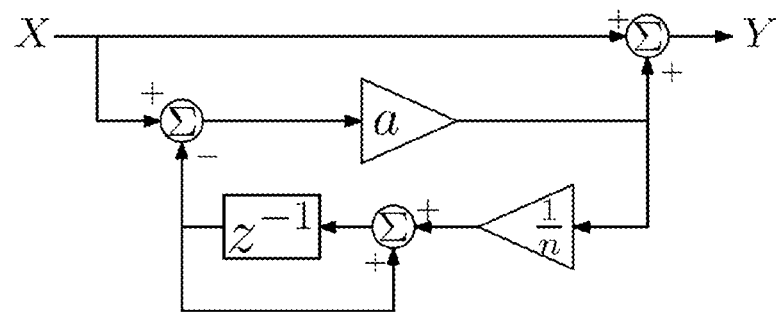
FIG. 5 illustrates a possible implementation of a delay compensation filter.

One way to realize this filter is shown in FIG. 5. In (7) a denotes an extra parameter, typically between zero and one, to control the trade-off between overshoot and high-frequency gain (which becomes smaller when a is lowered) on the one hand and on the other hand the settling time (which becomes smaller when a is increased). When choosing a=n, the filter reduces to $1+n(1-z^{-1})$, which is an intuitive way for compensating delay based on a 'speed' estimate by differencing the signal, but this choice has a very high overshoot and strongly amplifies high frequencies.

As explained before, the input signal transfer function has been changed to the transfer A(z) of the first recombination filter, possibly with the delay thereof being compensated by a delay compensation filter. This is particularly interesting for angular sensors which provide an A/D conversion of a possibly fast-changing angle, because it allows improving the dynamic response, e.g. by providing a faster step response.

Additional digital filtering may be added to any of the exemplary embodiments of present invention, e.g. for increasing the signal-to-noise ratio by reducing the (noise) bandwidth. If such filtering incurs extra delay that cannot be tolerated in the envisioned application, this delay can be compensated, e.g. using the above type of delay compensation filter. Also, filters can be designed that provide filtering with near-zero latency, for instance by means of a tracking loop that is completely in the digital domain. Such digital PLL-like structures are known in the art. Also digital counterparts of the tracking loops in the present invention may be used. Note that in all these digital-domain tracking loops the issue of variability is absent, i.e. there are no uncertainties on loop filters, nor mismatch-related nonlinearity problems in the error evaluation block.

Figure 6:
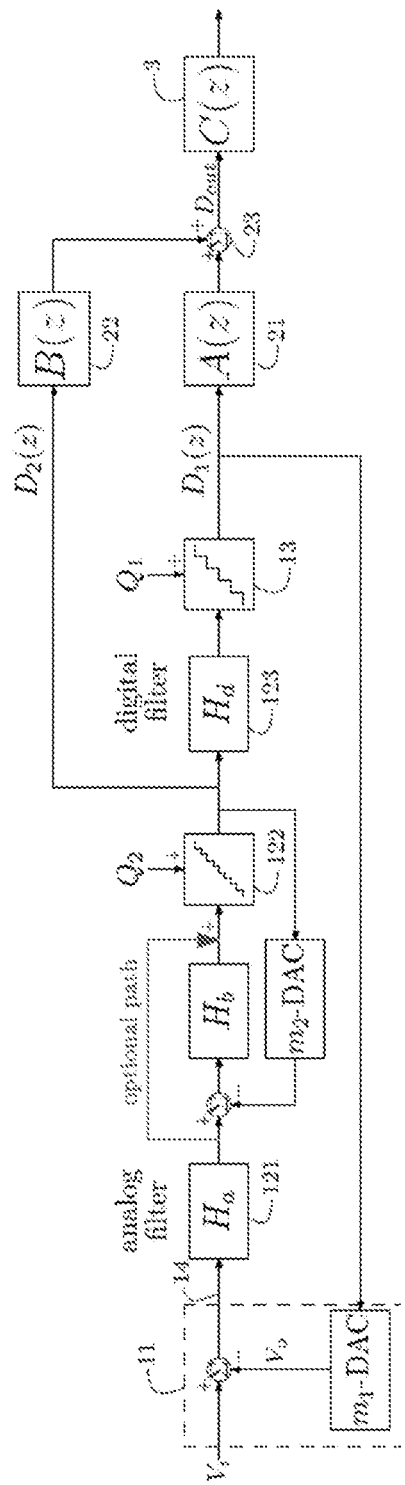
FIG. 6 illustrates an embodiment wherein inner-loop noise shaping is applied.

FIG. 6 shows an embodiment of the A/D converter according to the invention wherein inner-loop noise shaping is applied. The second quantizer $Q_2$ is embedded in an internal feedback loop, having an analog loop filter with transfer function $H_b$, and a local feedback DAC. The dynamics of the local loop is dictated by its signal transfer function $H_b/(1+H_b)$. For a first-order filter $H_b=z^{-1}/(1-z^{-1})$ this signal transfer function is a simple delay $z^{-1}$. This simple delay can be directly incorporated in the total delay n of the global feedback loop. The delay may also be avoided by adding the optional path shown on the figure. This optional path has the known effect that it makes the signal transfer function of the local loop equal to one. In such cases the local loop does not alter the dynamic behaviour of the global feedback loop. The main effect of the local loop is therefore that it applies noise-shaping to the quantization noise $Q_2$ of the second quantizer. The equivalent quantization noise of the inner loop (which can be considered a quantizer on its own) is $Q_2/(1+H_b)$.

An additional advantage of the system with inner-loop noise-shaping is that the non-linearity of the local feedback DAC is suppressed by the global loop. This means that multi-bit DACs can be applied with less stringent conditions on the linearity.

It is not required that both quantizers $Q_1$ and $Q_2$ operate at the same rate. For instance, the inner feedback loop around $Q_2$ and possibly also the digital filter with transfer function $H_d$ may be operated at a higher rate compared to the global feedback loop. The first quantizer $Q_1$ then subsamples the digital filter output $H_d$.

In electronic systems process, supply voltage and temperature (PVT) are important sources of variability. The analog filter transfer $H_a$ is typically affected by these PVT effects. For instance, a continuous-time integrator—a particular choice for the analog filter—can easily have a time constant which deviates 30% from its nominal design value. Even larger deviations may exist, for instance in certain tracking loops where the overall proportionality factor or gain of the error generation block depends on an amplitude of some input signals, as is for instance the case in a multiplier-based phase detector. Another example is a tracking loop position/rotation sensor based on sensing the direction of a magnetic field. The strength of the magnetic field may then represent another variable factor affecting the gain of the analog filter transfer $H_a$.

Some embodiments with adaptive schemes are now presented that can provide effective cancellation of $Q_1$ even in view of variability of the analog transfer function $H_a$. First, the impact of mismatch is discussed.

The condition (4) links two digital filters to an analog transfer function $H_a$. Because the analog transfer function is subject to various sources of variability, the equation is in general not met exactly. In order to investigate the impact of mismatch between the real $H_a$ on the one hand, and the nominal transfer used for the choice of the digital recombination filters $H_{a,nom}=A(z)/B(z)$ on the other hand, the relative mismatch may be defined as $$\Delta(z) = \frac{H_a(z)}{A(z)/B(z)} - 1 \qquad (8)$$

Note that $\Delta(z)$ is identical zero if and only if the condition (4) is met.

Consider, as an example, an uncertainty in the gain K of the analog transfer $H_a$, which deviates from the nominal value $K_{nom}$ that is used for sizing the recombination filters A and B. Then, in this case (8) reduces to $$\Delta = \frac{K - K_{nom}}{K_{nom}},$$

i.e. $\Delta$ then represents a measure for the relative deviation of K from $K_{nom}$.

Taking into account a relative mismatch (8), an analysis as set out above can be made. The compensated output $D_{out}$ is then:

$$D_{out}(z) = A(z)\left\{[1 + \Delta(z)NTF(z)]\left(V_i + \frac{1}{H_a(z)}Q_2\right) - \Delta(z)NTF(z)Q_1\right\} \qquad (9)$$

As expected, this equation reduces to expression (5) when $\Delta=0$. From (9), it can be deduced that the analog-to-digital converted output signal $D_{out}$ as provided by the present invention has a signal transfer function $A(z)$ $[1+\Delta(z)NTF(z)]$. A minor effect of a non-zero $\Delta$ is that it somewhat alters the transfer $A(z)$ of the input signal $V_i$ with an extra factor $1+\Delta(z)NTF(z)$. This can in most cases be neglected. In any case the signal transfer function $A(z)$ can be chosen more freely compared to the "classical" output $D_1$ which has a signal transfer function determined by the loop filters.

More important for present application are terms in (9) related to $Q_1$. From the last term of the above expression, it can be seen that a non-zero $\Delta$ leads to leakage of $Q_1$ noise into the compensated output $D_{out}$. Luckily, this leaked noise is shaped by NTF(z), which is the noise shaping created by both the analog filter $H_a$ and the digital filter $H_d$. When referred to the input, the leaked quantization noise is given by $\Delta(z)NTF(z)/(1+\Delta(z)NTF(z))Q_1$. For the "classical" output $D_1$ of the feedback loop as given by the first expression of (1), one has the input-referred contribution $NTF(z)/STF(z)Q_1$. The former is preferably smaller in some sense than the latter, which can only be the case when the relative mismatch $\Delta$ is restricted in some way. The following theorem can be proven:

If for a definite frequency f one has that $$|\Delta(z)|<1/(|STF(z)|+|NTF(z)|) \text{ with } z=\exp(j2\pi f) \qquad (10)$$

then the magnitude of the input-referred $Q_1$ noise at frequency f is smaller for the analog-to-digital converted output signal $D_{out}$ compared to the magnitude of the input-referred $Q_1$ noise when using the "classical" output $D_1$. Note that (10) is not a necessary condition, but merely provides a convenient sufficient condition. Fortunately, equation (10) is in most cases not very restrictive and relative mismatches $\Delta$ in the order of a few percent, even 10% and more are likely to agree with (10). Furthermore, if (10) is met for all frequencies f, it is guaranteed less input-referred $Q_1$ noise is present in $D_{out}$ compared to $D_1$. However, even if expression (10) would be violated for some frequencies, it is still possible that the integrated power of the leaked quantization noise is smaller than the integrated power of the quantization noise $Q_1$ present in the "classical" output $D_1$. In other words, if there is more $Q_1$-related noise at some frequencies this can be offset by less noise being present at other frequencies. Therefore, it can be concluded that a very broad range of recombination filters $A(z)$ and $B(z)$ exist which result in the analog-to-digital converted output signal $D_{out}$ being less dependent on the quantization noise $Q_1$ compared to the "classical" output $D_1$ of the feedback loop. The latter may be quantified by comparing the signal-to-noise ratio (SNR) of $D_{out}$ to the SNR of the "classical" output $D_1$. While the recombination filters $A(z)$ and $B(z)$ may be chosen starting from (4) and taking into account the design freedom indicated by (8) and (9), other design procedures are also possible. For instance, one may $A(z)$ and/or $B(z)$ to be parameterized filters, e.g. an FIR filter with variable coefficients, and then determine the optimum filter parameters which maximize the SNR of $D_{out}$. When the optimum SNR of $D_{out}$ turns out to be lower than the SNR of $D_1$, a choice is obtained for $A(z)$ and $B(z)$ that by construction provides a compensated output $D_{out}$ being less dependent on the quantization noise $Q_1$ compared to the "classical" output $D_1$ of the feedback loop. Such an optimization approach also provides extra flexibility for introducing a signal transfer function (corresponding to the recombination filter $A(z)$, as explained above) of a preferred form.

Figure 7:
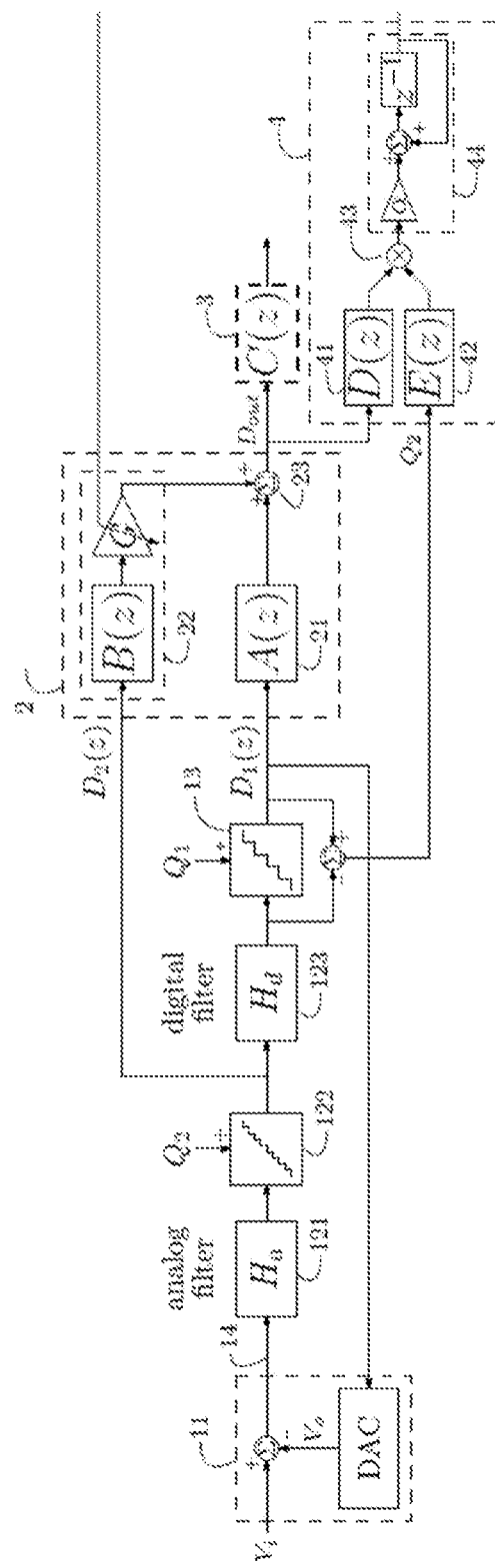
FIG. 7 illustrates an embodiment with adaptive gain correction.

In another embodiment the gain-variability of the analog filter $H_a$ is counteracted by introducing a compensating scale factor, for instance in the second recombination filter. This approach is illustrated in FIG. 7. In this embodiment the second recombination filter (22) comprises a programmable gain G, which allows scaling a signal in accordance with a gain control signal. The gain control signal is generated by a gain controller unit (4) which receives the output of the recombiner block (2) and the quantization noise $Q_1$. The quantization noise $Q_1$ can for instance be calculated by subtracting the input of the first quantizer from its output, both input and output being signals in the digital domain. The gain controller unit (4) comprises filtering means D(z) (41) and E(z) (42) for filtering its input signals, a multiplier (43) for making the product of these filtered signals and an adaptation controller (44) which adapts its output until its input signal becomes on the average zero.

Equation (9) provides the basis for understanding how the above and other more general adaptive schemes operate. For this, expression (9) is rewritten in the following more compact form:

$$D_{out}=A(z)V_i+A(z)/H_a(z)Q_2-\Delta(z)A(z)NTF(z)Q_1 \qquad (11)$$

For reasons of clarity, the effect $\Delta$ has on the signal transfer function is disregarded. Note that this approximation is not strictly needed, because the adaptive scheme makes $\Delta$ small, so the approximation becomes more accurate over time. The three terms in (11), corresponding to $V_i$, $Q_1$ and $Q_2$ respectively, may be considered statistically uncorrelated. Optionally a filter $D(z)$ may now be applied to the analog-to-digital converted output signal $D_{out}$ e.g. for reducing the signal-related component $V_i$. For instance, when $V_i$ occupies relatively low frequencies (as may be the case in an angular sensor), $D(z)$ could be a first order difference $1-z^{-1}$ or a second order difference $(1-z^{-1})^2$ which would largely eliminate the input signal component. The filtered output signal (i.e. $D(z)D_{out}$) is then given by eqn. (11) multiplied with $D(z)$. The last term of the filtered output signal is then of the form $\Delta(z)E(z)Q_1$ with $E(z)=D(z)A(z)NTF(z)$. Because $A(z)$, $D(z)$ and also $NTF(z)$ are known digital filter (see equation (2) for the NTF), $E(z)$ is also a known filter. Now $Q_1$ is a calculable digital signal, and this can be filtered with the filter E(z). The filtered signals $D(z)D_{out}$ and $E(z)Q_1$ may then be multiplied, as is done in FIG. 7. The output of this multiplier provides a measure of the relative mismatch Δ (in a statistical sense). This multiplier output may be considered an error signal of the adaptation loop (which is to be minimized). It can indeed be shown that the expected value of the multiplier output is proportional to Δ, because the cross-terms in the product which relate to $V_i$ and $Q_2$ average to zero (since $V_i$ and $Q_2$ are uncorrelated to $Q_1$). Therefore, in accordance with present invention, the recombination filter A(z) and/or B(z) may be taken as adaptive filter. The parameters of the adaptive filter(s) may then be adapted in accordance to methods known in the art for minimizing the error signal, e.g. minimizing this error signal in a mean squared sense.

While the invention has been illustrated and described in detail in the drawings and foregoing description, such illustration and description are to be considered illustrative or exemplary and not restrictive. The foregoing description details certain embodiments of the invention. It will be appreciated, however, that no matter how detailed the foregoing appears in text, the invention may be practiced in many ways. The invention is not limited to the disclosed embodiments.

Other variations to the disclosed embodiments can be understood and effected by those skilled in the art in practicing the claimed invention, from a study of the drawings, the disclosure and the appended claims. In the claims, the word "comprising" does not exclude other elements or steps, and the indefinite article "a" or "an" does not exclude a plurality. A single processor or other unit may fulfil the functions of several items recited in the claims. The mere fact that certain measures are recited in mutually different dependent claims does not indicate that a combination of these measures cannot be used to advantage. A computer program may be stored/distributed on a suitable medium, such as an optical storage medium or a solid-state medium supplied together with or as part of other hardware, but may also be distributed in other forms, such as via the Internet or other wired or wireless telecommunication systems. Any reference signs in the claims should not be construed as limiting the scope.

The invention claimed is:

1. An analog-to-digital converter comprising:
    a first quantizer arranged for yielding a first digital signal;
    an error signal generation block arranged for generating an error signal representative of a difference between an analog input signal and said first digital signal;
    an analog loop filter arranged for receiving said error signal;
    a second quantizer arranged for receiving an output signal of said analog loop filter and for outputting a second digital signal;
    a digital loop filter arranged for receiving said second digital signal and for providing an input signal to said first quantizer;
    a recombiner block comprising a first recombination filter arranged to receive said first digital signal, a second recombination filter arranged to receive said second digital signal and an adder circuit for adding outputs of said first and said second recombination filter, said first and said second recombination filter being selected to obtain an analog-to-digital converted output signal being less dependent on quantization noise caused by said first quantizer than said first digital signal.

2. The analog-to-digital converter as in claim 1, wherein said analog loop filter has a transfer function substantially equal to the ratio of said first recombination filter's transfer function and said second recombination filter's transfer function.

3. The analog-to-digital converter as in claim 1, wherein said first recombination filter and/or said second recombination filter are Finite Impulse Response filters.

4. The analog-to-digital converter as in claim 1, wherein said first recombination filter and/or said second recombination filter are adaptive.

5. The analog-to-digital converter as in claim 4, wherein said first recombination filter and/or said second recombination filter are adapted to remove a dependency of said analog-to-digital converted output signal from said quantization noise caused by said first quantizer.

6. The analog-to-digital converter as in claim 4, wherein said first recombination filter and/or said second recombination filter has a programmable gain.

7. The analog-to-digital converter as in claim 6, comprising a gain controller unit to determine said programmable gain.

8. The analog-to-digital converter as in claim 1, wherein said first quantizer has a lower resolution than said second quantizer.

9. The analog-to-digital converter as in claim 1, comprising a delay compensation filter to compensate for a delay introduced by said first recombination filter.

10. The analog-to-digital converter as in claim 1, wherein said digital loop filter comprises an accumulator/integrator.

11. The analog-to-digital converter as in claim 10, wherein said digital loop filter comprises a feedforward path for improving the dynamic response of said feedback loop.

12. The analog-to-digital converter as in claim 1, wherein said second quantizer is embedded in an internal feedback loop comprising a further analog loop filter and a feedback digital-to-analog converter.

13. The analog-to-digital converter as in claim 1, wherein said error signal generation block comprises a digital-to-analog conversion circuit.

14. The analog-to-digital converter as in claim 1, wherein said analog input signal is derived from a set of sensor elements.

15. The analog-to-digital converter as in claim 14, comprising a combiner circuit for combining signals from said set of sensor elements and generating said error signal.

* * * * *